United States Patent
Nagy et al.

(10) Patent No.: US 12,405,542 B2
(45) Date of Patent: Sep. 2, 2025

(54) METHOD OF DETERMINING A MARK MEASUREMENT SEQUENCE, STAGE APPARATUS AND LITHOGRAPHIC APPARATUS

(71) Applicant: ASML NETHERLANDS B.V., Veldhoven (NL)

(72) Inventors: István Nagy, Eindhoven (NL); Özer Duman, Eindhoven (NL); Arjan Gijsbertsen, Vught (NL); Pieter Jacob Heres, Veldhoven (NL); Rudolf Michiel Hermans, Eindhoven (NL); Erik Jansen, Eindhoven (NL); Thomas Augustus Mattaar, Veldhoven (NL); Norbertus Josephus Martinus Van Den Nieuwelaar, Tilburg (NL); Petrus Franciscus Van Gils, Rijen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 861 days.

(21) Appl. No.: 17/628,959

(22) PCT Filed: Jul. 16, 2020

(86) PCT No.: PCT/EP2020/070211
§ 371 (c)(1),
(2) Date: Jan. 21, 2022

(87) PCT Pub. No.: WO2021/018627
PCT Pub. Date: Feb. 4, 2021

(65) Prior Publication Data
US 2022/0260933 A1    Aug. 18, 2022

(30) Foreign Application Priority Data

Jul. 30, 2019   (EP) .................................. 19189017

(51) Int. Cl.
*G06F 30/398*    (2020.01)
*G03F 9/00*       (2006.01)

(52) U.S. Cl.
CPC .......... *G03F 9/7046* (2013.01); *G03F 9/7088* (2013.01); *G06F 30/398* (2020.01); *G03F 9/7096* (2013.01)

(58) Field of Classification Search
CPC ........ G03F 7/24; G03F 7/70341; G03F 7/705; G03F 7/70725; G03F 7/70783;
(Continued)

(56) References Cited

U.S. PATENT DOCUMENTS

| 5,311,282 A | 5/1994 | Someya et al. |
| 6,020,964 A | 2/2000 | Loopstra et al. |

(Continued)

FOREIGN PATENT DOCUMENTS

| EP | 0864929 | 9/1998 |
| JP | H10177951 | 6/1998 |

(Continued)

OTHER PUBLICATIONS

Office Action issued in corresponding Japanese Patent Application No. 2022-500943, dated Mar. 17, 2023.
(Continued)

*Primary Examiner* — Binh C Tat
(74) *Attorney, Agent, or Firm* — Pillsbury Winthrop Shaw Pittman, LLP

(57) ABSTRACT

A method of determining a mark measurement sequence for an object comprising a plurality of marks, the method including: receiving location data for the plurality of marks that are to be measured; obtaining a boundary model of a positioning device used for performing the mark measure-
(Continued)

ment sequence; and determining the mark measurement sequence based on the location data and the boundary model.

28 Claims, 9 Drawing Sheets

(58) Field of Classification Search
CPC ............. G03F 7/70875; G03F 7/70441; G03F 7/70525; G03F 7/70558; G03F 7/706; G03F 9/7046; G03F 1/70; G03F 7/70125; G03F 7/70258; G03F 7/70425; G03F 7/70508; G03F 7/7055; G03F 7/70616; G03F 7/70625; G03F 7/70633; G03F 7/70641; G03F 7/70666; G03F 7/70675; G03F 9/7026; G03F 9/7088; G03F 9/7096; G06F 30/398; H01L 2224/73265; H01L 2924/00; H01L 21/265; H01L 21/28123
USPC .................................................. 716/118–125
See application file for complete search history.

(56) References Cited

U.S. PATENT DOCUMENTS

| 6,952,253 | B2 | 10/2005 | Lof et al. |
|---|---|---|---|
| 2001/0052512 | A1 | 12/2001 | Hunter et al. |
| 2001/0053962 | A1 | 12/2001 | Yoshida et al. |
| 2004/0102863 | A1 | 5/2004 | Yoshida et al. |
| 2004/0166425 | A1 | 8/2004 | Van Der Sande |
| 2005/0140959 | A1 | 6/2005 | Someya et al. |
| 2005/0270507 | A1 | 12/2005 | Kondo |
| 2006/0033916 | A1 | 2/2006 | Sugihara et al. |
| 2007/0011112 | A1 | 1/2007 | Yoshida et al. |
| 2007/0058173 | A1 | 3/2007 | Holzapfel |
| 2007/0212652 | A1 | 9/2007 | Lalbahadoersing et al. |
| 2012/0133914 | A1 | 5/2012 | Prosyentsov et al. |
| 2013/0182231 | A1 | 7/2013 | Hoogendam et al. |
| 2016/0349627 | A1 | 12/2016 | Van Der Schaar et al. |
| 2017/0212429 | A1* | 7/2017 | Koevoets ............ G03F 7/70783 |
| 2017/0363950 | A1* | 12/2017 | Sriraman ................ G06F 30/20 |
| 2018/0157161 | A1* | 6/2018 | Mailfert ................ G06F 30/367 |
| 2019/0107781 | A1 | 4/2019 | Tinnemans et al. |
| 2019/0155175 | A1 | 5/2019 | Shibazaki |

FOREIGN PATENT DOCUMENTS

| JP | H11111590 | 4/1999 |
|---|---|---|
| JP | 200283762 | 3/2002 |
| JP | 2015220447 | 12/2015 |
| TW | 200741379 | 11/2007 |
| TW | 201227858 | 7/2012 |
| TW | I563349 | 12/2016 |
| WO | 0188638 | 11/2001 |
| WO | 2018/010928 | 1/2018 |

OTHER PUBLICATIONS

International Search Report and Written Opinion issued in corresponding PCT Patent Application No. PCT/EP2020/070211, dated Nov. 26, 2020.
Taiwanese Office Action issued in corresponding Taiwanese Patent Application No. 109125510, dated Nov. 11, 2021.
Boerland, H. et al.: "Automated mask qualification with new CD metrology in CATS environment", Proc. of SPIE, vol. 634942 (2006).

* cited by examiner

METHOD OF DETERMINING A MARK MEASUREMENT SEQUENCE, STAGE APPARATUS AND LITHOGRAPHIC APPARATUS

CROSS-REFERENCE TO RELATED APPLICATION

This application is the U.S. national phase entry of PCT Patent Application No. PCT/EP2020/070211 which was filed on Jul. 16, 2020, which claims the benefit of priority of European Patent Application No. 19189017.7 which was filed on Jul. 30, 2019 and which is incorporated herein in its entirety by reference.

FIELD

The present invention relates to determining a measurement sequence for a plurality of marks or markings on an object such as a semiconductor substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Semiconductor devices that are made using lithographic patterning typically have a stack of multiple layers, e.g. 20-30 layers. In order for the device to properly function, it is important that the consecutive layers are properly aligned. In order to realise this, accurate knowledge of a position of a patterned layer needs to be known, before a next layer can be patterned on top of it. Said knowledge about the position of a patterned layer is generally obtained by determining the position of marks or markings on the substrate. Such marks or markings may e.g. be referred to as alignment marks. When increasingly smaller features need to be patterned, more detailed knowledge about the position of a previously patterned layer may be needed. In order to obtain this more detailed knowledge, an increased number of alignment marks may need to be measured. Such a measurement process may become rather time-consuming and even affect the throughput of the lithographic apparatus.

SUMMARY

It would be desirable to execute a measurement sequence, during which a characteristic of a plurality of markings that are distributed across a substrate is measured, more efficiently.

In order to do so, according to a first aspect of the invention, a method of determining a mark measurement sequence for an object comprising a plurality of marks is provided, the method comprising:
  receiving location data for the plurality of marks that are to be measured;
  obtaining a boundary model of a positioning device used for performing the mark measurement sequence, and
  determining the mark measurement sequence based on the location data and the boundary model.

In accordance with the present invention, the mark measurement sequence is not merely determined on location data, i.e. positional information about the plurality of marks on the object, but rather also takes account of the capabilities and/or restrictions of the positioning device involved in performing or executing the mark measurement sequence. By doing so, a mark measurement sequence is obtained that is more robust, i.e. is less prone to cause damage to the positioning device when executed and/or is more efficient, i.e. results in a shorter time to execute the mark measurement sequence.

According to a further aspect of the invention, there is provided a stage apparatus for performing a mark measurement sequence for an object comprising a plurality of marks, the stage apparatus comprising:
  an object table for holding the object;
  a positioning device for positioning the object table during an execution of the mark measurement sequence, and
  a control unit for controlling the positioning device during the execution of the mark measurement sequence,
  wherein the control unit is configured to receive the mark measurement sequence obtained by the method according to the invention.

According to a second aspect of the invention, there provided a method of determining a mark measurement sequence for an object comprising a plurality of marks, the mark measurement sequence to be performed by a stage apparatus holding the object, the method comprising:
  receiving location data for the plurality of marks that are to be measured;
  determining a mark measurement sequence based on the location data;
  determining an average dissipation profile for one or more positioning devices of the stage apparatus that are involved in performing the mark measurement sequence, based on the determined mark measurement sequence;
  determining a temperature profile for the one or more positioning devices based on the determined average dissipation profile.
  adjusting a performance parameter of the one or more positioning devices if a temperature of the one or more positioning devices exceeds a temperature limit, based on the temperature profile.

According to yet another aspect of the invention, there is provided a lithographic apparatus comprising a stage apparatus according to the invention.

According to yet another aspect of the invention, there is provided a computer program product configured to, when run on a computer, perform the method according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
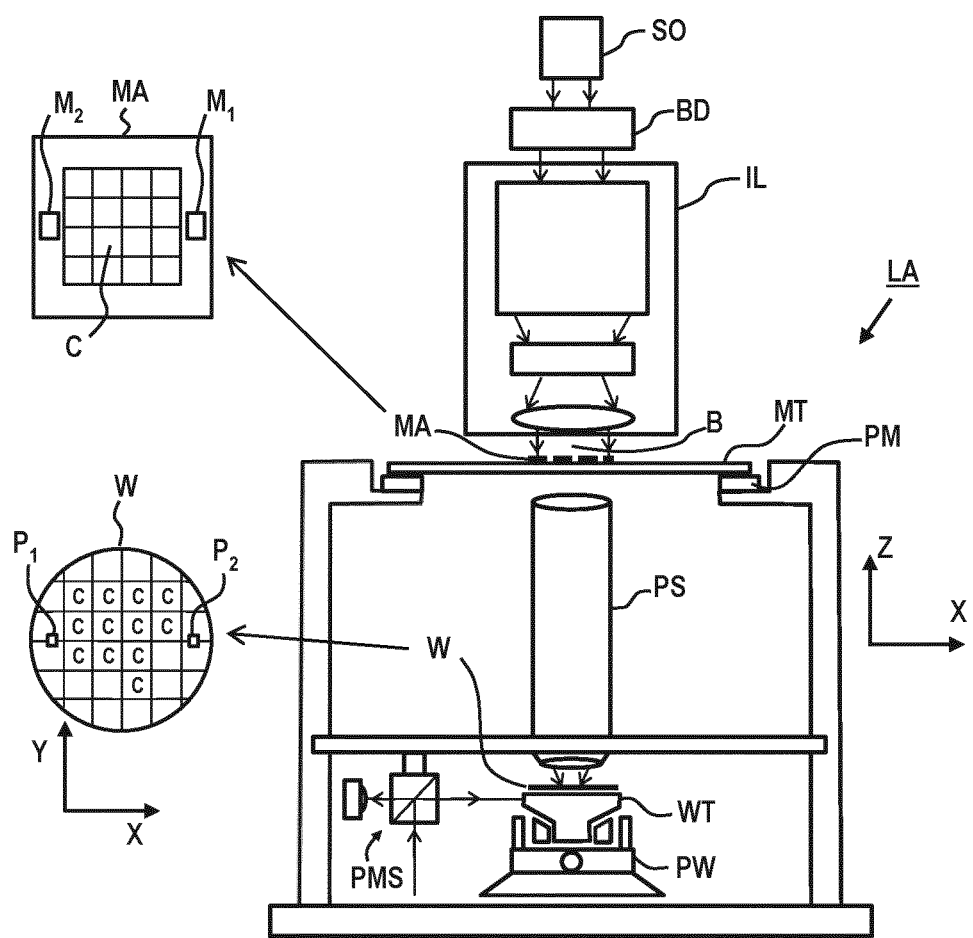
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2.

Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
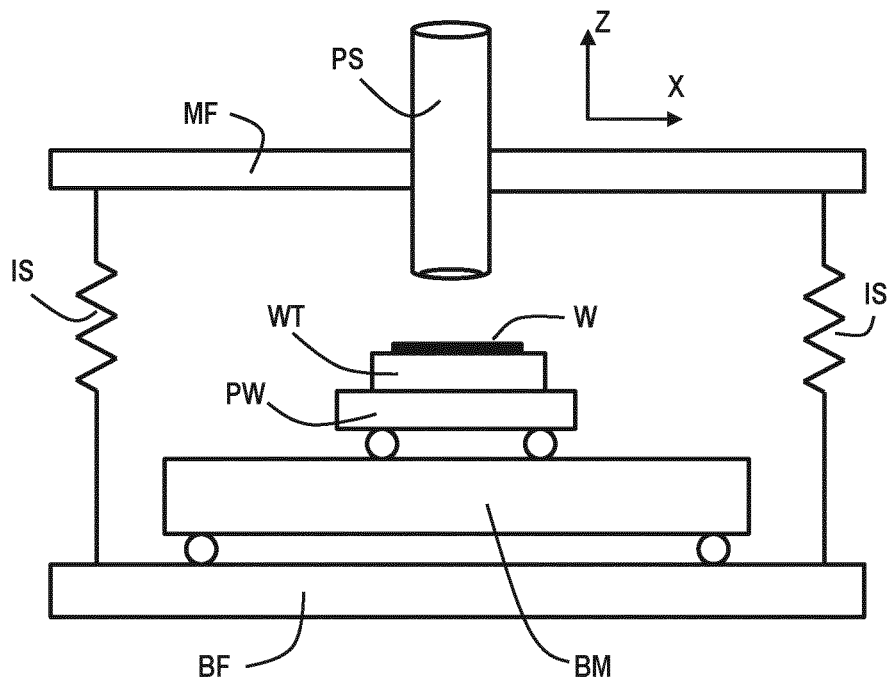
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, United States patent U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
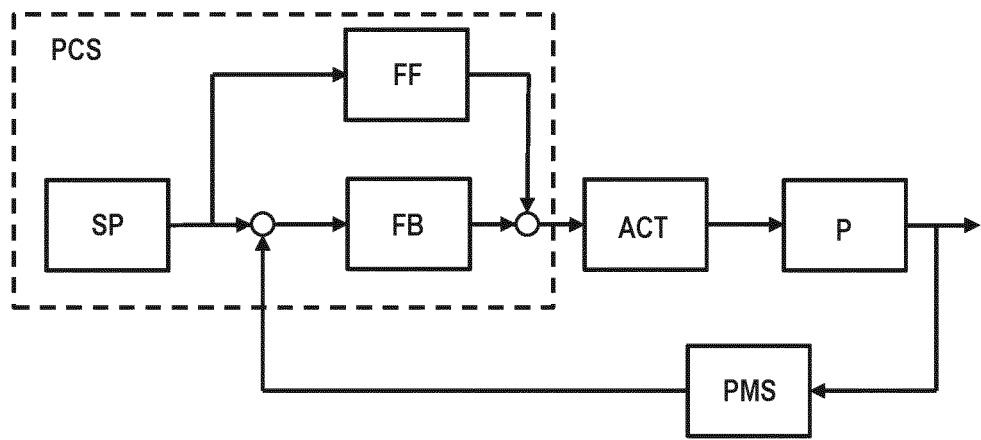
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

In order to accurately pattern a substrate with a patterned beam of radiation, use is made, as indicated above, of alignment marks that are present on the substrate and on the patterning device. Prior to the patterning of the substrate, a position of the alignment marks, e.g. substrate alignment marks P1, P2 as described above, is determined. Based on this positional information, i.e. information indicating where the marks are located on the substrate, one can determine the required relative position of the patterned radiation beam and the substrate, in order to ensure that the pattern that is exposed onto the substrate is properly aligned with a previously patterned layer of the substrate.

Figure 4:
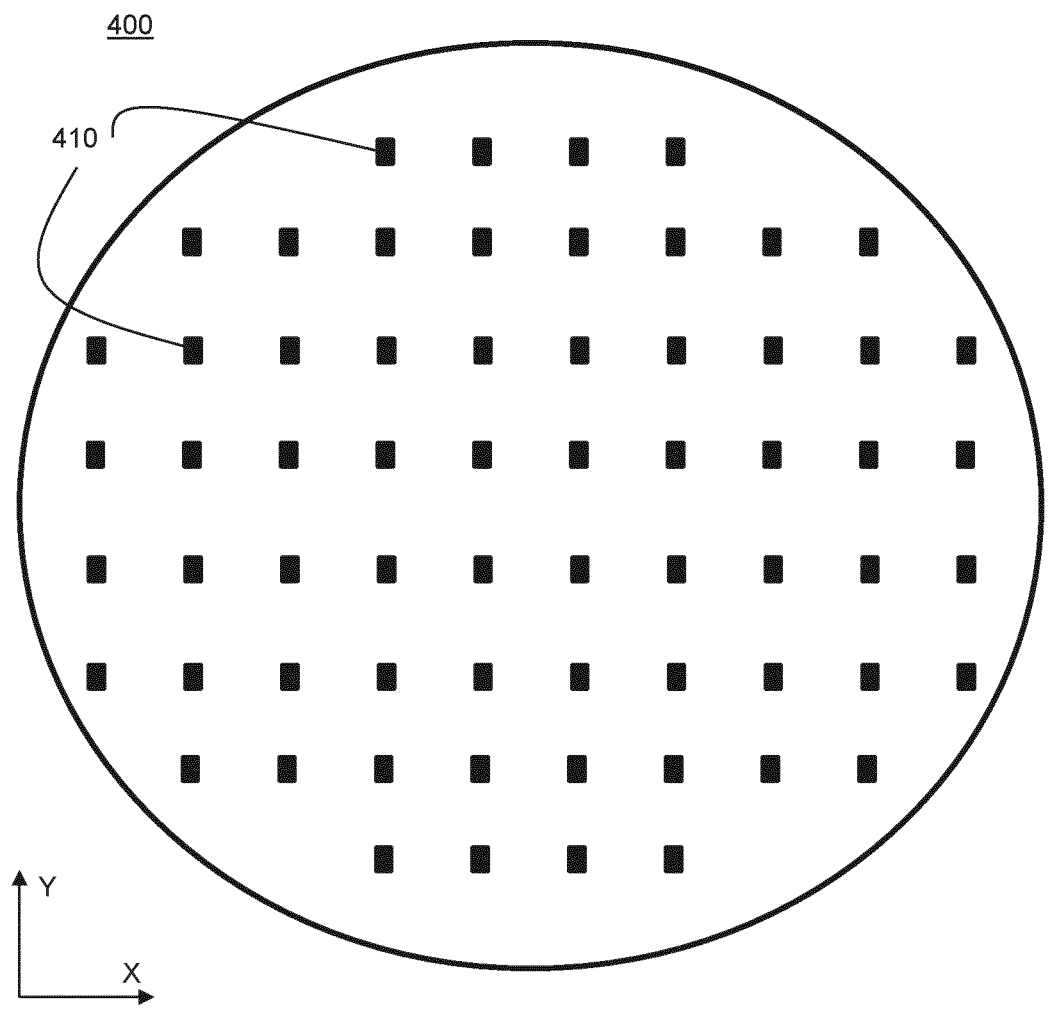
FIG. 4 schematically shows a top view of substrate and a plurality of alignment marks on the substrate 400.

FIG. 4 schematically shows a top view of substrate 400 and a plurality of alignment marks 410 on the substrate 400. So, prior to the exposure of the substrate 400 with a patterned radiation beam, an accurate position of the marks 410 is to be determined. Within the meaning of the present invention, the measurement of the position of a mark such as an alignment mark is referred to as a mark measurement or an alignment mark measurement.

In order to measure the position of the alignment marks 410, the substrate 400 needs to be positioned such that the marks 410 are in a capturing range of the measurement device that is used to perform the mark measurement. Such a measurement device may e.g. include an alignment sensor, i.e. a sensor configured to determine a position of an alignment mark or marking.

As such, in order to measure the position of a plurality of marks 410, the substrate 400 has to be repositioned various times since typically, as can be seen in FIG. 4, the plurality of marks are distributed across the substrate. Such repositioning of the substrate can be performed using a stage apparatus according to the present invention.

Such a stage apparatus may e.g. comprise a substrate support or object table onto which the substrate 400 can be mounted, and one or more positioners or positioning devices for positioning and displacing the support or object table.

Such a positioner or positioning device may include one or more actuators or motors, e.g. electromagnetic or piezoelectric motors. In an embodiment, the stage apparatus according to the invention may also serve to position a substrate in a lithographic apparatus. In such embodiment, the object table of the stage apparatus may correspond to the substrate support WT and the positioner or positing device may correspond to the second positioner PW as discussed above.

It is desirable to perform the measurement sequence of the plurality of marks 410 as efficient as possible, thereby e g minimizing the required time to perform the measurements and/or maximizing or optimizing the number of marks that can be measured during the available time. In this respect, it can be mentioned that increasing the number of marks that can be measured, can result in more detailed information about the location of the target portions C as discussed above. This enables a more accurate exposure process which can result in an improved overlay between consecutive layers on the substrate. By increasing the efficiency of the measurement sequence, the processing time of a substrate by a lithographic apparatus can be reduced, thus increasing the number of substrates that can be processed per unit of time. Alternatively, or in addition, the yield may improve as well, due to a more accurate exposure process.

Within the meaning of the present invention, a measurement sequence refers to the sequence or order in which a plurality of measurements are to be performed. As such, a mark measurement sequence refers to the order in which a plurality of marks are to be measured. Such a measurement sequence or mark measurement sequence may thus comprises a collection of points or locations on a substrate that need to be explored and the order in which the points or locations need to be measured. As will be detailed below, in an embodiment of the present invention, a mark measurement sequence can comprise additional parameters or information, e.g. displacement parameters characterising the displacement required during the mark measurement sequence.

In a known arrangement, a measurement sequence of a plurality of marks is determined based on the displacements that need to be performed by the stage apparatus, i.e. taking into account the distances between the plurality of marks 410. In such arrangement, a measurement sequence can e.g. be selected or determined in which the total distance travelled during the measurement sequence is minimized; the total distance travelled referring to the sum of all displacements needed to perform the measurement sequence.

Figure 5:
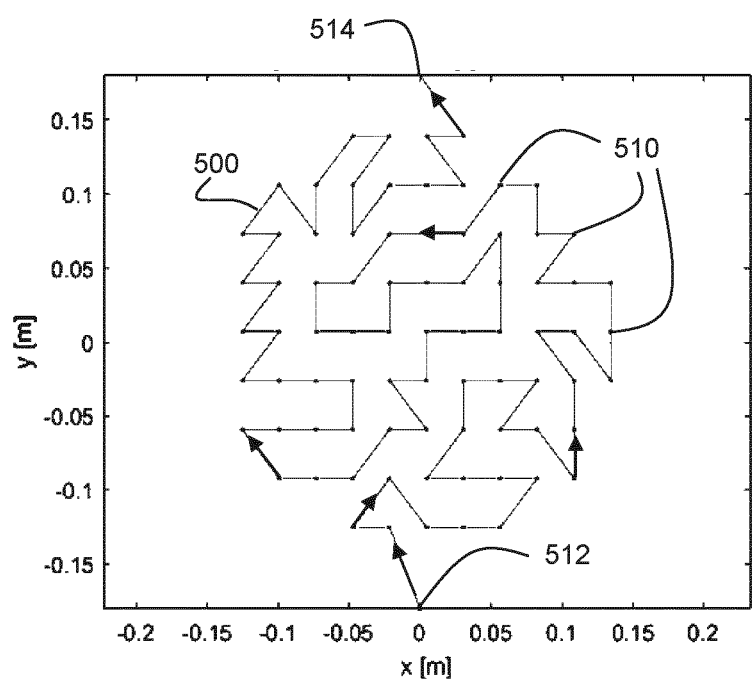
FIG. 5 schematically shows a measurement sequence or route to be followed based on a minimization of the total distance.

FIG. 5 schematically shows such a measurement sequence 500 or route to be followed, whereby the route or measurement sequence 500 is determined by using a distance norm, i.e. by minimizing the total distance travelled. FIG. 5 schematically shows a lay-out of a plurality of marks 510 in an XY-plane that need to be measured, i.e. their position or location needs to be determined. The measurement sequence has a fixed starting point 512 and a fixed end point 514. No other constraints are imposed during the determination of the measurement sequence.

It has been observed that a minimisation of the total distance that needs to be travelled may not be optimal, i.e. a minimisation of the total distance travelled does not necessarily result in a minimisation of the duration of the execution of the measurement sequence. In particular, it has been observed that when such a measurement sequence, i.e. a measurement sequence having a minimized total distance travelled, is executed, an overheating of the positioning device of the stage apparatus may occur. Phrased differently, when one attempts to execute the measurement sequence as determined, with nominal or maximal performance parameters of the positioning device, e.g. maximal acceleration or jerk, the positioning device would overheat. Within the meaning of the present invention, performance parameters of the motor may e.g. refer to allowable or obtainable speed, acceleration or jerk.

In order to avoid an overheating of the positioning device, one may need to limit or clip the allowable performance parameters of the positioning device during the measurement sequence. Phrased differently, the measurement sequence whereby the total distance travelled is minimized can only be performed when a reduced acceleration or jerk is applied or imposed for the positioning device. Typically, one would then limit the allowable performance parameters of the positioning device, e.g. the allowable acceleration/deceleration of the positioning device, to such extend that they could be applied for all possible or required mark measurement sequences. By doing so, the full potential of the positioning device is however not used.

In the known arrangement, a mark measurement sequence with a minimized total distance travelled, is thus executed with reduced performance parameters of the positioning device.

It has been observed by the inventors that such an approach is sub-optimal. Therefore, the present invention proposes a different approach to determine a measurement sequence for a plurality of marks on an object, e.g. a substrate. It has been devised by the inventors that an improved result can be obtained when the capability of the positioning device is taken into account when determining the mark measurement sequence.

In accordance with the invention, the capability or capabilities of the positioning device, or the boundaries of the capabilities of the positioning device, are taken into account by determining the mark measurement sequence based on a boundary model of the positioning device. Such a boundary model can, in general, take account of a particular operating limit or constraint of the positioning device. In an embodiment, the boundary model comprises a power limit of the positioning device. Such a power limit may e.g. relate to the allowable dissipation in the positioning device. Since there is a correlation between the dissipation in positioning device and the forces or accelerations as generated by the positioning device, the boundary model may also comprises an acceleration limit or force limit. Alternatively, or in addition, the boundary model may, in an embodiment of the present invention, comprise a thermal model of the positioning device. In such embodiment, the thermal model of the positioning device is thus used when the mark measurement sequence is determined. Note that the positioning device referred to is the positioning device that is used to perform the mark measurement sequence. By using a thermal model of the positioning device, a thermal characteristic or thermal behavior of the positioning device can be taken into account. Within the meaning of the present invention, a thermal model refers to information or data that enables to correlate a performance characteristic or parameter, or an operating characteristic or parameter, of the positioning device with a thermal state of the positioning device. A thermal model may e.g. be based on design data of the positioning device, optionally combined with design data of a cooling system of the positioning device. Alternatively, or in addition, a thermal model can also be based on empirical data. A thermal model may e.g. comprise or consist of a look-up table which correlates a particular performance characteristic of the positioning device with a thermal state, e.g. a temperature or temperature rise, of the positioning device. Such particular performance characteristic may e.g. be a displacement action from a first position to a second position. Such a displacement action can e.g. be characterized by having a first period during which the object table that holds the object is accelerated and a second period during which the object table is decelerated. In between the first and second period, there may be a third period during which the object table travels at a substantially constant speed. When the positioning device performs such a displacement action, a temperature rise may occur. The correlation between the performance of the displacement action and the occurring temperature rise may be considered or considered part of a thermal model as applied in the present invention.

Positioning devices as applied in lithographic apparatus, e.g. to displace the substrate support WT or the mask support MT as discussed above, may include one or more electromagnetic actuators or motors. Such electromagnetic actuators or motors include one or more current carrying coils which warm up during use, e.g. due to the Ohmic losses generated in the coils. The current carrying coils further cause the generation of a force, e.g. a force that is exerted on an object table such as the above described substrate support WT or mask support MT. Said force will cause the object table to accelerate or decelerate. As such, a correlation can be determined between a performance parameter or operation of the positioning device, e.g. an acceleration or particular displacement action of the positioning device and the occurring losses. In case the boundary model as applied in the present invention, is a power-based boundary model, the model may e.g. impose a limit or constraint to the power that is dissipated over time. In case of the use of a thermal model, the occurring losses may e.g. be correlated to an occurring temperature of the positioning device, e.g. a temperature of a coil of the positioning device. In accordance with the present invention, the boundary model of the position device will be used to determine a mark measurement sequence, as will be illustrated in more detail below.

Figure 6:
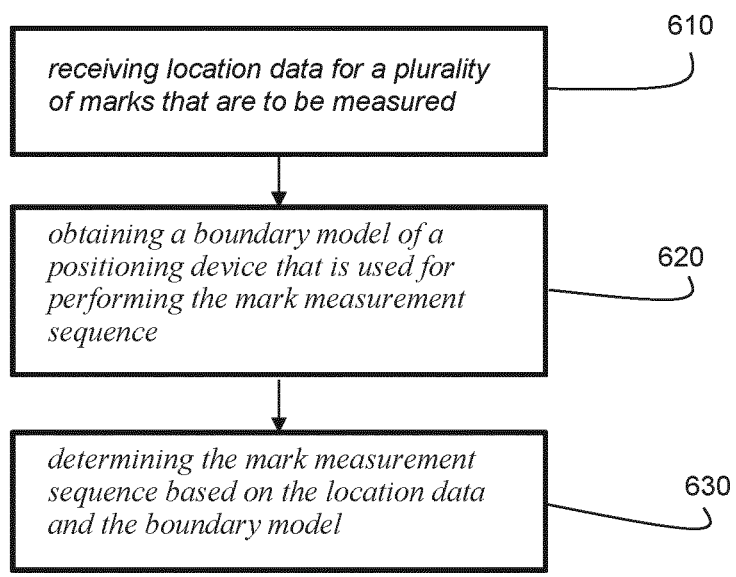
FIG. 6 schematically shows a flow-chart 600 of a method according to an embodiment of the present invention.

FIG. 6 schematically shows a flow-chart 600 of a method according to an embodiment of the present invention, said method being a method of determining a mark measurement sequence. The method comprising a first step 610 of receiving location data for a plurality of marks that are to be measured. Such location data may e.g. comprises the coordinates of the marks in a local coordinate system linked to the object. Such location data can e.g. refer to manufacturing data of the substrate marks, i.e. location data applied during the manufacturing of the plurality of marks. The location data may also be referred to as data describing the nominal positions of the marks, i.e. the positions where the marks should be in the ideal case. The method further comprises a second step 620 of obtaining a boundary model of a positioning device that is used for performing the mark measurement sequence. Such a boundary model of the positioning device thus enables to take account the capability or a limit or constraint on the capabilities of the positioning device into account. Such a limit or constraint can e.g. be a power limit, an acceleration limit or a thermal limit. The method further comprises a third step 630 of determining the mark measurement sequence based on the location data and the boundary model.

Using the method according to present invention, as illustrated in the flow-chart 600, a mark measurement sequence is obtained that takes account of the boundary or constraint imposed by the boundary model of the positioning device. By doing so, one can ensure that the mark measurement sequence as determined can be executed by the positioning device, e.g. without causing an overheating or other type of malfunctioning of the positioning device. Compared to the know manner to determine a mark measurement sequence, whereby a total distance travelled is minimized, the method according to the present invention does not require imposing limitations or constraints afterwards, i.e. when the mark measurement sequence has already been established. As will be illustrated in more detail below, the method according to the present invention results in a more robust mark measurement sequence and in a faster, i.e. more efficient, mark measurement sequence when executed. The latter advantage is obtained due to the fact that the boundary or constraint w.r.t. the capabilities of the positioning device is actually taken into account while the mark measurement sequence is determined.

In an embodiment of the present invention, the method of determining a mark measurement sequence further comprises:
    obtaining thermal state information of the positioning device, the thermal state information representing a thermal state of the positioning device prior to, or at the start of, an execution of the mark measurement sequence, and
    determining the mark measurement sequence based on the thermal state information.
Alternatively, or in addition, an embodiment of the method according to the present invention can also take account of any further processing of the object after the measurement sequence In such embodiment, the thermal state information as obtained may thus represent a thermal state of the positioning device after a further processing of the object, said further processing occurring after an execution of the mark measurement sequence. In particular, in such embodiment, account can be taken of the thermal effects of such further processing on the positioning device. In case of a processing of a semiconductor substrate, such further processing could e.g. involve performing an exposure sequence on the substrate.

Within the meaning of the present invention, thermal state information of the positioning device refers to information which provides information about a thermal state of the positioning device, e.g. a temperature of a component of the positioning device. Such thermal state information can be obtained from a thermal model or may be based on empirical data. In an embodiment, the thermal state information as applied refers to the thermal state of the positioning device at an instant prior to the execution of the mark measurement sequence. The thermal state information may e.g. refer to the thermal state of the positioning device at the start of the mark measurement sequence. Such a thermal state of the positioning device may also be referred to as an initial thermal state of the position device; 'initial' referring to the thermal state considered being the thermal state at the beginning or at the start of the mark measurement sequence. With respect to this embodiment, it can be pointed out that a stage apparatus that performs the mark measurement sequence would typically perform a series of consecutive processes. Within the meaning of the present invention, such a series of consecutive processes as performed by a stage apparatus can also be referred to as an operating series or operating sequence of the stage apparatus. In case the mark measurement sequence is performed by a stand-alone inspection tool, such a stand-alone tool may e.g. perform consecutive mark measurement sequences on a lot of substrates or on a part thereof. In case the mark measurement sequence is performed by an integrated inspection tool or apparatus, e.g. integrated in a lithographic apparatus, the stage apparatus of such an integrated inspection tool may e.g. alternatingly perform mark measurement sequences and exposure sequences. In particular, the stage apparatus may be equipped to, when a substrate is loaded, e.g. onto an object table of the stage apparatus, perform a mask measurement sequence on the substrate, followed by an exposure sequence on the same substrate. When the substrate is exposed, it can be unloaded and a next substrate is loaded onto the object table. In such arrangement, the initial thermal state of a positioning device of the stage apparatus, i.e. the thermal state at the start of the mask measurement sequence, may thus depend on the exposure sequence performed on a previous object, i.e. a previously processed substrate. This is illustrated in FIG. 7.

Figure 7:
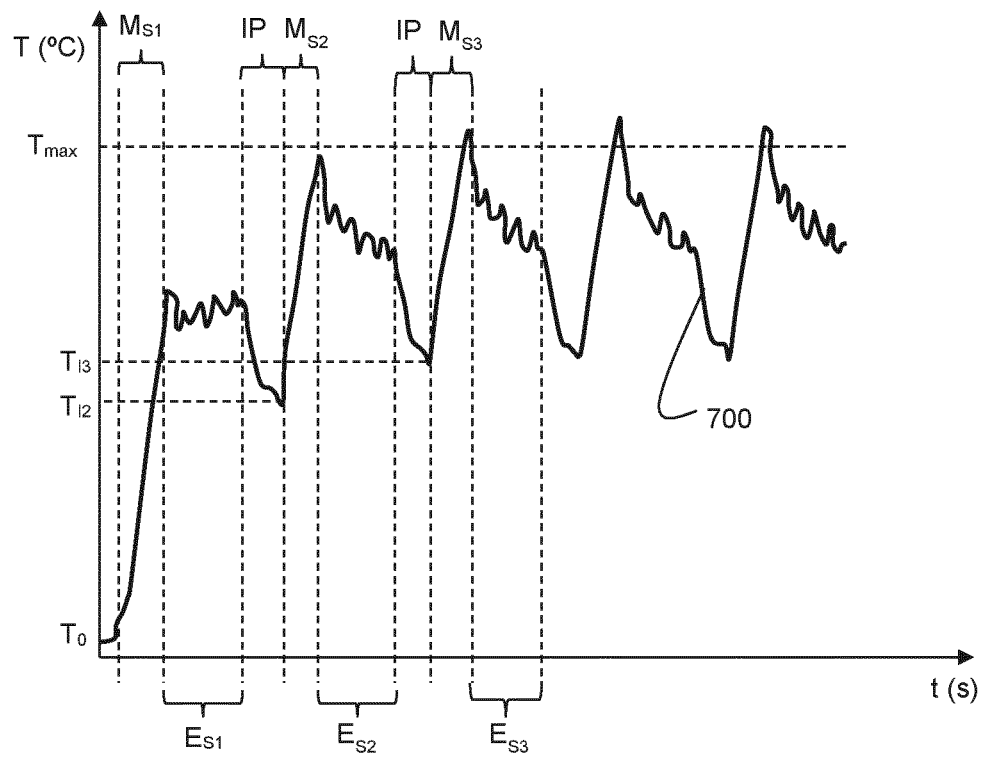
FIG. 7 schematically illustrates the thermal behavior of a positioning device used to perform mask measurement sequences and exposure sequences of a set of substrates.

FIG. 7 schematically illustrates the thermal behavior of a positioning device used to perform mask measurement sequences and exposure sequences of a set of substrates. FIG. 7 schematically shows a graph 700 indicative of the temperature T of the positioning device as a function of time t, starting from an initial cold state at temperature $T=T_0$, at $t=0$. It is assumed that at $t=0$, a first substrate S1 is loaded onto an object table. During period $M_{S1}$, the first substrate S1 undergoes a mask measurement sequence during which a plurality of marks on the substrate S1 are measured, said measurement sequence e.g. being performed by a positioning device of a stage apparatus holding the substrate S1. Once the marks are measured, the object table, onto which the substrate S1 is mounted, is transferred, by the positioning device, to an expose position. In FIG. 7, period $E_{S1}$ denotes the period during which the substrate S1 is exposed. When the substrate S1 has been exposed, it can e.g. be unloaded and a second substrate S2 is loaded onto the stage apparatus or the object table of the stage apparatus. The unloading and loading processes can be considered to take place during an idle period IP. When substrate S2 is loaded onto an object table, it will undergo, during period $M_{S2}$, a mask measurement sequence during which a plurality of marks on the substrate S2 are measured, said measurement sequence e.g. being performed by the positioning device of a stage apparatus holding the substrate S2. Once the marks are measured, the object table, onto which the substrate S2 is mounted, is transferred, by the positioning device, to the expose position where, during period Est, the substrate S2 is exposed. When the substrate S2 has been exposed, it can e.g. be unloaded and a third substrate S3 is loaded onto the stage apparatus or the object table of the stage apparatus, whereupon the substrate S3 can be subjected to a mask measurement sequence, during a period $M_{S3}$ and an exposure sequence, during a period $E_{S3}$, in a similar manner as the first and second substrates. With respect to the idle period IP, it can be mentioned that in addition to an unloading and loading process, a substrate may undergo additional processes, prior to the mark measurement sequence or in between the mark measurement sequence and an exposure sequence. As an example of such an additional process, a levelling process during which a height map of the substrate is determined, can be mentioned. As will be understood by the skilled person, each of these additional processes may also affect a thermal state of the positioning device, since they would typically involve displacing the substrate by the positioning device. When such displacements are known, the thermal effects of these additional processes can be included in the aforementioned thermal state information.

In FIG. 7, $T_{max}$ denotes a temperature limit for the positioning device that performs the mask measurement sequence and the exposure sequence. As can be seen in the graph 700, a substantial temperature rise occurs during the execution of the mark measurement sequences, i.e. during periods $M_{S1}$, $M_{S2}$ and $M_{S3}$. During the exposure sequences or the idle periods, the temperature of the positioning device either substantially remains the same or decreases. It can further be observed that during the processing of the first substrate S1, the temperature T stays well below the maximum temperature $T_{max}$. Also during the processing of substrate S2, the temperature T stays below the maximum temperature $T_{max}$. However, as can be seen in graph 700, during the processing of substrate S3, the temperature T exceeds the maximum temperature $T_{max}$. The same holds for the substrates that are processed after substrate S3. The fact that the maximum temperature occurring during the processing of substrate S3 is higher than the maximum temperature during the processing of substrates S1 and S2 can be attributed to the fact that the temperature of the positioning device at the start of the processing of substrate S3, i.e. temperature $T_{I3}$, is higher than the temperature of the positioning device at the start of the processing of substrates S1 and S2, i.e. temperatures $T_0$ and $T_{I2}$ respectively. These initial temperatures thus influence the temperature rise occurring during the processing of the substrates. In an embodiment of the present invention, these initial temperatures, or initial thermal states of the positioning device, can be taken into account when determining the mark measurement sequence. By doing so, as will be detailed below, a mark measurement sequence can be determined which does not result in exceeding the maximum temperature of the positioning device used.

With respect to the graph 700 illustrating the temperature T of a positioning device during the processing of a set of substrates S1, S2, S3, . . . , it can further be pointed out that the temperature of the positioning device substantially stays the same during the exposure sequence of the substrate S1 and reduces during the exposure sequences of the substrate S2, S3 and following substrates. In this respect, it is worth mentioning that the temperature rise or fall during an exposure sequence may depend on the particular lay-out of the target areas on the substrate. As such, in case the initial thermal state of the positioning device is determined based on empirical data, it should be verified that the empirical data is also valid in case of a different lot of substrates having a different lay-out. In this respect, it can be mentioned that, in case of an expected increase of the temperature of the positioning device during an exposure sequence, such an expected temperature rise can be taken into account as well in the method according to the invention. In such embodiment one can e.g. take account of thermal state information related to processes that are performed before the execution of the mark measurement sequence but one can also take account of a thermal state that is expected to occur in the future, e.g. a thermal state of the positioning device after the exposure sequence. As such, an embodiment of the method according to the present invention can also take account of any future or further processing of the object after the measurement sequence, e.g. by using thermal state information related to such future processing. In such embodiment, the thermal state information may thus refer to a future thermal state of the positioning device, e.g. a thermal state after execution of the exposure sequence.

In an embodiment of the present invention, the thermal state information as applied, e.g. the initial thermal state of a positioning device, can be determined by:
  receiving process information representing a process to be performed by the positioning device prior to the execution of the mark measurement sequence and/or a further process to be performed by the positioning device after the execution of the mark measurement sequence; and
  determining the thermal state information based on the process information and a thermal model of the positioning device or stage apparatus.
In such embodiment, the process to be performed prior to the execution of the mark measurement sequence can e.g. be an exposure sequence performed on a previous substrate. The process information may then e.g. include a trajectory to be followed by the positioning device during the exposure sequence and relevant performance or operational parameters such as acceleration or jerk of the positioning device during the exposure sequence. Based on the process information and a thermal model of the positing device, the thermal behavior of the positioning device can be determined, predicted or simulated, thus enabling to determine the thermal state of the positioning device when the exposure sequence is finished. Note that, in a similar manner, the thermal behavior of the positioning device during the idle periods IP as shown in FIG. 7, can be taken into account. During the idle periods, a stage apparatus holding a substrate may e.g. be displaced from an exposure position to a docking position, in order for a processed substrate to be unloaded and a to-be-processed substrate to be loaded.

In an embodiment of the present invention, the step of determining the mark measurement sequence comprises determining a displacement parameter for the positioning device, the displacement parameter being applied by the positioning device during an execution of the mark measurement sequence. Within the meaning of the present invention, a displacement parameter for the positioning device can be any parameter characterising the displacement of the object, e.g. the substrate, during the mark measurement sequence. As such, it can e.g. be a velocity, an acceleration or a jerk as applied during the mark measurement sequence or during part of the mark measurement sequence. In such embodiment, the method according to the present invention may not only determine the trajectory to be followed, i.e. the sequence or order in which the plurality of marks are to be measured, but also how the object table holding the object has to be displaced during the mark measurement sequence. In particular, in an embodiment, determining the mark measurement sequence may comprise determining a velocity profile for the positioning device during the execution of the mark measurement sequence. Such a velocity profile may thus describe at what velocity the object table needs to travel during the execution of the mark measurement sequence. Within the meaning of the present invention, the displacement parameters of the position device may also be referred to as VAJs (Velocity, Acceleration, Jerk).

Figure 8:
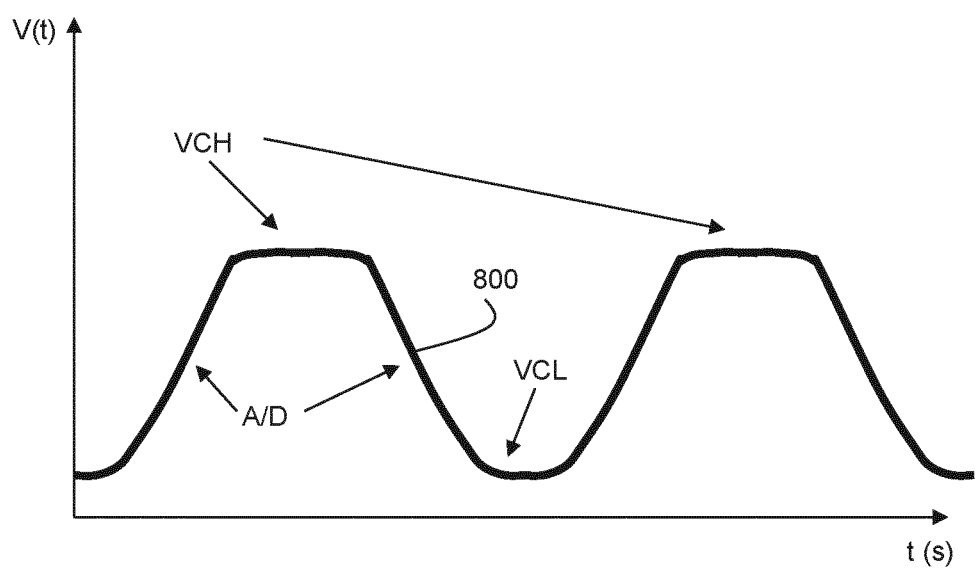
FIG. 8 schematically illustrates a velocity profile during part of a mark measurement sequence.

FIG. 8 schematically shows part of a velocity profile 800 to be followed by an object table holding an object, in order to perform mark measurements during a mark measurement sequence. The velocity profile 800 illustrates the velocity V(t) as a function of time t. As can be seen, the velocity profile V(t) comprises portions A/D during which the object or object table holding the object is either accelerated or decelerated, i.e. portions during which the velocity profile has a non-zero slope. The velocity profile V(t) further comprises portions VCH during which the velocity is substantially constant and comparatively high. During said portions the object or object table is e.g. displaced between two consecutive mark measurement locations. The velocity profile V(t) further comprises portions VCL during which the velocity is substantially constant and comparatively low. During said portions, the mark measurement may actually be performed. The slope of the velocity profile V(t), i.e. dV(t)/dt, can be considered to represent the required acceleration a(t) of the object or object table to obtain the velocity profile. Similarly, the jerk j(t) of the object or object table can be determined as da(t)/dt, i.e. the time-derivative of the acceleration profile a(t).

In an embodiment of the present invention, the displacement parameter or parameters, VAJs, of the positioning device are determined for two different directions, e.g. two substantially orthogonal directions defining a plane substantially parallel to the surface of the object. In particular, assuming the surface of the object to define an XY-plane, it may be advantageous to determine the displacement parameters for the X-direction during the mark measurement sequence and for the Y-direction during the mark measurement sequence. In such embodiment, the method according to the present invention may e.g. comprise determining a velocity profile for the X-direction and a velocity profile for the Y-direction. In this respect, it is worth mentioning that a stage apparatus configured to perform a mark measurement sequence or an exposure sequence typically needs to make a plurality of displacements or displacement steps in either the X-direction or the Y-direction. As a convention, the Y-direction may be considered to coincide with a scanning direction of a lithographic apparatus performing the exposure sequence, the X-direction being substantially perpendicular to the Y-direction. In order to realize such displacements, a positioning device of such a stage apparatus is typically equipped with multiple actuators or motors, each of said actuators or motors being configured to exert forces in a particular direction, e.g. either the X-direction or the Y-direction.

As such, in an embodiment of the present invention, the stage apparatus as applied to perform the mark measurement sequence can comprises a positioning device that comprises one or more actuators or motors for exerting a force in the X-direction and one or more motors for exerting a force in the Y-direction. Within the meaning of the present invention, motors or actuators that are configured to exert a force in the X-direction may be referred to as X-motors or X-actuators, whereas motors or actuators that are configured to exert a force in the Y-direction may be referred to as Y-motors or Y-actuators. The velocity profile 800 as schematically shown in FIG. 8 can e.g. represent a velocity profile of such an X-motor or Y-motor.

In an embodiment of the present invention, the boundary model of the positioning device comprises a first operating limit or boundary or constraint for operations in the X-direction and a second operating limit or boundary or constraint for operations in the Y-direction. In such embodiment, the first operating limit may e.g. be correlated to an allowable dissipation of an X-motor or X-actuator of the positioning device performing the mask measurement sequence, whereas the second operating limit may e.g. be correlated to an allowable dissipation of an Y-motor or Y-actuator of the positioning device performing the mask measurement sequence.

In case of electromagnetic actuators or motors, the following can be mentioned with respect to generated forces and dissipation: electromagnetic actuators or motors typically generate a force due to interaction of a current carrying coil and an external magnetic field, said magnetic field e.g. generated by means of permanent magnets. As an approximation, one can consider the force as generated to be proportional to the current I supplied to the coil of the actuator or motor. It can further be pointed out that the acceleration of the object that is driven, e.g. an object table holding an object such as a substrate, is proportional to the applied force and thus also proportional to the current I supplied to the coil. Further, it can be mentioned that the dissipation in the coil of the actuator or motor is proportional to the square of the current I, i.e. proportional to $I^2$. Since the dissipation is the primary cause of heating of the coil, setting a limit to the occurring dissipation during the mark measurement sequence may be an effective manner to ensure that a temperature of the coil does not exceed a maximum temperature.

As such, in an embodiment of the present invention, the boundary model of the positioning device comprises a dissipation limit for the positioning device.

Such a dissipation limit may e.g. be expressed as:

$$\int_0^{Tm} P\mathrm{diss}(t)dt = E < E\mathrm{max} \tag{1}$$

In the equation, Tm can e.g. correspond to the duration of the mark measurement sequence, Pdiss(t) can e.g. be the time-dependent dissipation occurring in the positioning device. The dissipation integrated over time corresponds to an amount of energy E which can e.g. be constraint to be lower than a predetermined value Emax.

Alternatively, the average dissipation over a period of time may be used as a dissipation limit for the positioning device $$\frac{1}{Tm}\int_0^{Tm} Pdiss(t)dt = \text{Pdiss\_average} < \text{Pdiss\_average\_max} \quad (2)$$

In the equation (2), Pdiss_average refers to the average dissipation over the period Tm, said average dissipation being constraint to a maximum value Pdiss_average_max. Since the dissipation is proportional to $I^2$, and the current I can be considered to be proportional to the acceleration a, an alternative boundary model of the positioning device may comprise an acceleration limit:

$$\frac{1}{Tm}\int_0^{Tm} a^2(t)dt = a^2\_\text{average} < a^2\_\text{average\_max} \quad (3)$$

In equation (3), a(t) represents the time-dependent acceleration of the positioning device, $a^2$_average is the average of the acceleration squared over period Tm, and $a^2$_average_max is the boundary limit imposed to the average acceleration squared. Alternatively, the RMS value of the acceleration a(t) can be limited, whereby the RMS value is e.g. calculated over the period Tm it takes to execute the mark measurement sequence:

$$\sqrt{\frac{1}{Tm}\int_0^{Tm} a^2(t)dt} = \text{a\_RMS} < \text{a\_RMS\_max} \quad (4)$$

In an embodiment, the boundary model may comprise a boundary value or limit for the RMS value of the acceleration in the X-direction during the mark measurement sequence and a boundary value or limit for the RMS value of the acceleration in the Y-direction during the mark measurement sequence.

In an embodiment, the dissipation limit or acceleration limit as proposed in the above equations (1)-(4) may also be evaluated over a smaller period of time than the period or duration of the mark measurement sequence. In such embodiment, the mark measurement sequence as performed may e.g. be subdivided in two or more periods whereby a dissipation limit or acceleration limit is evaluated or imposed for each period.

In an embodiment, as already indicated above, the determination of the mark measurement sequence takes account of thermal state information of the positioning device, the thermal state information being indicative for the thermal state of the positioning device prior to the execution of the mark measurement sequence or after the execution of the mark measurement sequence. In an embodiment, the thermal state information can be taken into account by incorporating the information in the boundary model of the positioning device. In such embodiment, the dissipation limit or acceleration limit may e.g. be a function of the thermal state information. As an example, the maximum average dissipation over the mark measurement sequence can e.g. be described as:

$$P\text{diss\_average\_max\_}TI = F(P\text{diss\_average\_max\_}T0, TI, T0, T\text{max}) \quad (5)$$

In equation (5), Pdiss_average_max_TI represents the maximum average dissipation during the mark measurement sequence when the initial temperature of the positioning device is TI.

Pdiss_average_max_TI is describes as a function F of Pdiss_average_max_T0, and temperatures T0, TI and Tmax.

Pdiss_average_max_T0=the maximum average dissipation during the mark measurement sequence when the initial temperature of the positioning device is T0, as e.g. shown in FIG. 7, Tmax=the maximum temperature of the positioning device, as e.g. shown in FIG. 7, TI=the initial temperature of the positioning device at the start of the mark measurement sequence, e.g. corresponding to $T_{I2}$ or $T_{I3}$ shown in FIG. 7. In an embodiment of the present invention, the boundary model of the positioning device comprises a thermal model of the positioning device. In such embodiment, the thermal model of the positioning device may e.g. provide information about a thermal state of the positioning device during or at the end of the mask measurement sequence. The thermal model may e.g. use as input an initial or first estimate mark measurement sequence. In such embodiment, the applied mark measurement sequence may e.g. comprise both the order in which the plurality of marks have to be measured and one or more displacement parameters of the positioning device that are applied during the execution of the mark measurement sequence. Based on said applied mark measurement sequence, the thermal model may then provide information about the thermal state of the position device during and/or after the execution of the mark measurement sequence. In particular, the thermal model may e.g. be configured to determine a temperature of the positioning device during and/or after the execution of the mark measurement sequence. Said determined temperature may then be compared to a maximum temperature, e.g. Tmax as shown in FIG. 7. In case the determined temperature exceeds the maximum temperature, the initial mark measurement sequence is to be modified or replaced by an alternative mark measurement sequence.

As already discussed above, the objective of the present invention is to derive a mark measurement sequence that takes account of a performance constraint of a positioning device performing the mask measurement sequence. Typically, in preparation of an exposure process as performed by a lithographic apparatus, 10 to 50 or more marks need to be measured, in order to enable a sufficiently accurate determination of a location of the target areas for the exposure process. It can further be mentioned that in future it may be desired to further increase the number of marks that are measured or that need to be measured. As will be appreciated by the skilled person, when such a number of marks needs to be measured, the number of possible measurement sequences or routes is substantial. In case of N marks to be measured there are theoretically N! routes connecting all the marks. If, in addition, the displacement parameters as applied by the positioning device when displacing from mark n to mark n+1 are considered variables as well, it will be appreciated that this poses a complex problem to be solved. Such problem can be characterised as an optimisation problem with a large number of variables. In this particular case, it would desirable to arrive at a solution of the problem that is close to the optimal solution, i.e. whereby the duration of the execution of the mark measurement sequence is close to the theoretical minimum, while taking account of a boundary or constraint imposed by the positioning device.

In an embodiment of the present invention, the mark measurement sequence can be obtained by performing an iteration scheme. Such an iteration scheme may e.g. start from an initial mark measurement sequence. Said initial mark measurement sequence may e.g. be determined based on an optimisation of the total distance travelled and may include a set of nominal displacement parameters e.g. nominal values of the velocity, acceleration and jerk of the positioning device. Said initial mark measurement sequence may then be verified to comply with the boundary model of the positioning device. If the mark measurement sequence complies with the boundary model, then the displacement parameters may be adjusted so as to decrease the duration of the execution of the mark measurement sequence, e.g. by increasing the applied acceleration or velocity during the mark measurement sequence or a part thereof, e.g. between a mark n and a mark n+1. If the mark measurement sequence does not comply with the boundary model, then the mark measurement sequence may be adjusted and/or the displacement parameter or parameters may be adjusted so as to better comply with the boundary or constraint imposed by the boundary model.

In an embodiment of the present invention, the mentioned optimisation problem is handled by using an optimisation algorithm. Such an optimisation algorithm may e.g. be a heuristic optimisation algorithm such as a genetic algorithm or a simulated annealing algorithm.

Further optimisation methods worth mentioning are Tabu Search, Ant Colony Optimisation (ACO) and Particle Swarm Optimisation (PSO). It can also be pointed out that a combination of different optimization techniques or algorithms may be applied as well.

In an embodiment, the optimisation algorithm may comprise a cost function that is to be minimised. Said cost function may e.g. comprise a duration of the execution of the mark measurement function. In such embodiment, the aim of the optimisation algorithm, e.g. the genetic algorithm or the simulated annealing algorithm would be to minimize the cost function, thus minimizing the duration of the execution of the mark measurement sequence.

Heuristic optimisation algorithms in general determine a plurality of possible solutions to the posed optimisation problem and have particular manners or rules to accept or discard certain solutions and to select a preferred solution. In case of a constrained problem, e.g. a problem whereby a solution found would ideally be an optimal solution but the solution also has to meet constraints, various options exist to take account of the constraint or constraints.

In an embodiment, the optimisation algorithm can be configured to only accept solutions that meet the constraints and only use those solutions during the optimisation process.

Alternatively, the optimisation method can be configured in such manner that the constraints are incorporated in the cost function. In such embodiment, the cost function thus incorporates both a time constraint, e.g. the duration of the mark measurement sequence and a boundary or constraint imposed by the positioning device. The boundary imposed by the positioning device may e.g. be a dissipation limit or thermal limit of the positioning device. As an example, the cost function can take the dissipation Pdiss(i) of a possible mark measurement sequence into account as:

$$CF(i) = Tm(i) + e^{\left(\frac{Pdiss(i)}{Pdiss\_max}\right)^2} \quad (6)$$

Wherein:
CF(i)=the cost function for mark measurement sequence i as determined by the optimisation algorithm;
Tm(i)=the duration of the mark measurement sequence (i);
Pdiss(i)=the dissipation occurring when the mark measurement sequence i would be executed;
Pdiss_max: the maximum allowable dissipation when the mark measurement sequence is executed.

Note that the second term in the cost function CF is larger than 1 when Pdiss(i) is larger than Pdiss_max and is smaller than 1 when Pdiss(i) is larger than Pdiss_max. By doing so, solutions that have Pdiss(i) larger than Pdiss_max are penalized and will not result in an optimal solution. Note that the first and/or second term in equation (6) can be provided with weight factors as well.

In a similar manner, a thermal state or a temperature associated with the execution of the particular mark measurement sequence i can be taken into account.

As such, in an embodiment of the present invention, the cost function of the optimisation algorithm comprises a thermal state of the positioning device during and/or after the execution of the mark measurement sequence, or a temperature constraint, a power constraint or an acceleration constraint.

In an embodiment, the application of the optimisation algorithm may involve the following steps:
  determining a plurality of possible mark measurement sequences;
  evaluating the plurality of possible mark measurement sequences using the cost function;
  selecting one of the possible mark measurement sequences as the mark measurement sequence, based on the evaluation.

In an embodiment, the evaluating of the plurality of possible mark measurement sequences may e.g. comprise selecting, based on the evaluation, a subset of the plurality of mark measurement sequences and using this subset of solutions to determine further possible mark measurement sequences. In such embodiment, the application of the optimisation algorithm may thus comprise:
  a. determining a plurality of possible mark measurement sequences;
  b. evaluating the plurality of possible mark measurement sequences using the cost function;
  c. determining a further plurality of possible mark measurement sequences based on the evaluation;
  d. further evaluating the further plurality of possible mark measurement sequences using the cost function;
  e. selecting one of the further possible mark measurement sequences as the mark measurement sequence, based on the further evaluation.

In an embodiment, steps c and d can be repeated several times, whereby, during each evaluation step, a subset of the further plurality of possible mark measurement sequences is selected and used for determining or generating a following set or plurality of possible solutions. During the evaluation steps of the described methods, it can be determined whether the behaviour of the positioning device complies with the boundary model, for each of the plurality of possible mark measurement sequences.

In the embodiments as discussed so far, the mark measurement sequence has been determined while taking account of a boundary model, said model e.g. characterizing a thermal behavior of a positioning device that is to execute the mark measurement sequence.

It can be acknowledged that such a process of determining the mark measurement sequence may be time-consuming.

Therefore, in accordance with a second aspect of the invention, a method of determining a mark measurement sequence is proposed which can be executed faster while at the same time allowing a less conservative approach with respect to the applied VAJs, i.e. an approach whereby VAJs of positioning devices are constrained in such manner that each mark measurement sequence can be executed without exceeding a dissipation limit of the positioning device involved.

In accordance with the second aspect of the invention, the method of determining a mark measurement sequence involves a first step of determining a routing for measuring the required marks, without taking account of any constraints of the stage apparatus that is to perform the mark measurement sequence. Such a sequence or routing may e.g. be an optimal, e.g. distance-optimized, routing. In an embodiment, the mark measurement sequence may e.g. be referred to as a distance-optimized mark measurement sequence, in that the distance to be travelled by the positioning device to measure all marks is optimized, i.e. minimized.

In a second step, an assessment is made whether or not the determined routing of the mark measurement sequence can be performed, taking account of the operating sequence of the stage apparatus. Within the meaning of the present invention, an operating sequence of a stage apparatus refers to the sequence of different processes that are performed consecutively by the stage apparatus. As already illustrated in FIG. 7, such an operating sequence can be associated with different operations that are performed on the substrates that are held by the stage apparatus. When considering the operating sequence of a particular substrate, also referred to as a wafer, such a sequence is often also referred to as life-of-a-wafer or LoaW. Such a LoaW can e.g. involve the following steps or sequences:

Loading of the substrate onto the stage apparatus;
Performing a measurement sequence on the substrate, e.g. including a mark measurement sequence;
Displacing the stage apparatus from a measurement position, where the measurement sequence was performed, to an exposure position;
Performing an exposure sequence on the substrate;
Displacing the stage apparatus to an unloading position;
Unloading the substrate.

Each of these steps or sequences can involve the operation of one or more positioning devices of the stage apparatus, such operation e.g. involving the application of a current to the positioning devices, so as to displace or position the stage apparatus to a desired location or position. Such a current will cause a dissipation in the positioning device, such a dissipation may also be referred to as a thermal load of the positioning device. As will appreciated by the skilled person, the different steps or sequences performed by the stage apparatus will typically involve the different positioning devices of the stage apparatus in different manners. Or phrased differently, the different positioning devices as applied in the stage apparatus will typically experience a different thermal load during each of the different sequences. It can further be pointed out that, the dissipation in the different positioning devices during the different steps or sequences can vary rapidly as a function of time. As such, when one wants to consider the instantaneous dissipation in each of the positioning devices involved, during the LoaW or a sequence of LoaWs, a substantial amount of data would need to be processed.

In order to avoid this, the present invention proposes to determine an average thermal load or dissipation for the positioning devices involved, for each of the different steps or sequences. With respect to the mark measurement sequence that is to be executed, the distance-optimized mark measurement sequence as determined in step 1 is considered. The mark measurement sequence illustrated in FIG. 4 can be considered such a routing. Said routing can be considered a sequence of displacements in either the X-direction, the Y-direction or both. A stage apparatus may e.g. include one or more X-movers and one or more Y-movers to realize these displacements. During the execution of the routing as depicted, the one or more X-movers will need to accelerate and decelerate the stage various times in order to arrive at the desired locations to perform the mark measurement. In this respect, reference can also be made to FIG. 8 and corresponding description.

In order to assess or determine the effect of such a displacement sequence as performed by the one or more X-movers on the temperature of the X-movers, the average dissipation occurring in the one or more X-movers during the mark measurement sequence is determined. The same is done for the Y-movers.

As already discussed above, the occurring dissipation can be considered proportional to the acceleration squared or the current squared. As such, given the displacement profile of the one or more X-movers, one can thus determine an average acceleration squared, as in eq. (3), or an average dissipation, as in eq. (2). The same holds for the Y-movers or other positioning devices as applied in the stage or stage apparatus.

In an embodiment of the present invention, the actual acceleration or current profiles as applied to the different positioning devices of the stage apparatus, during the different steps or sequences of a LoaW or operation sequence is determined. This is schematically illustrated in FIGS. 9(*a*) and 9(*b*).

Figure 9:
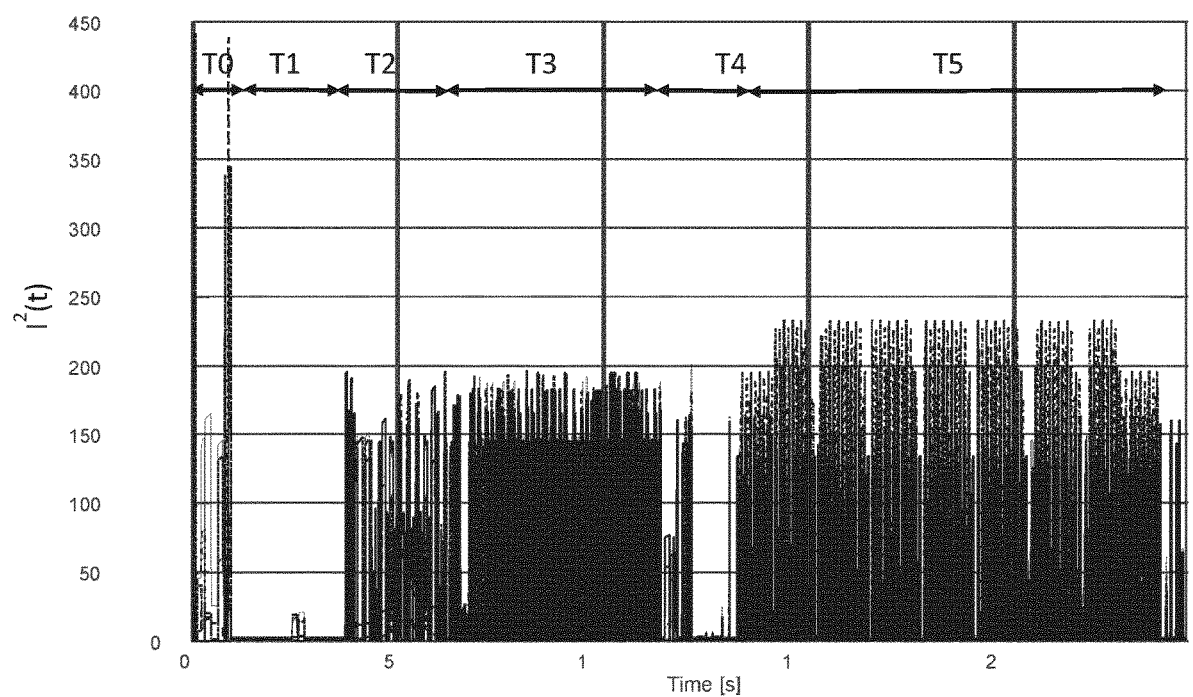
FIGS. 9(a)-9(c) schematically illustrate a method of determining a mark measurement sequence according to a second aspect of the invention.
Figure 9:
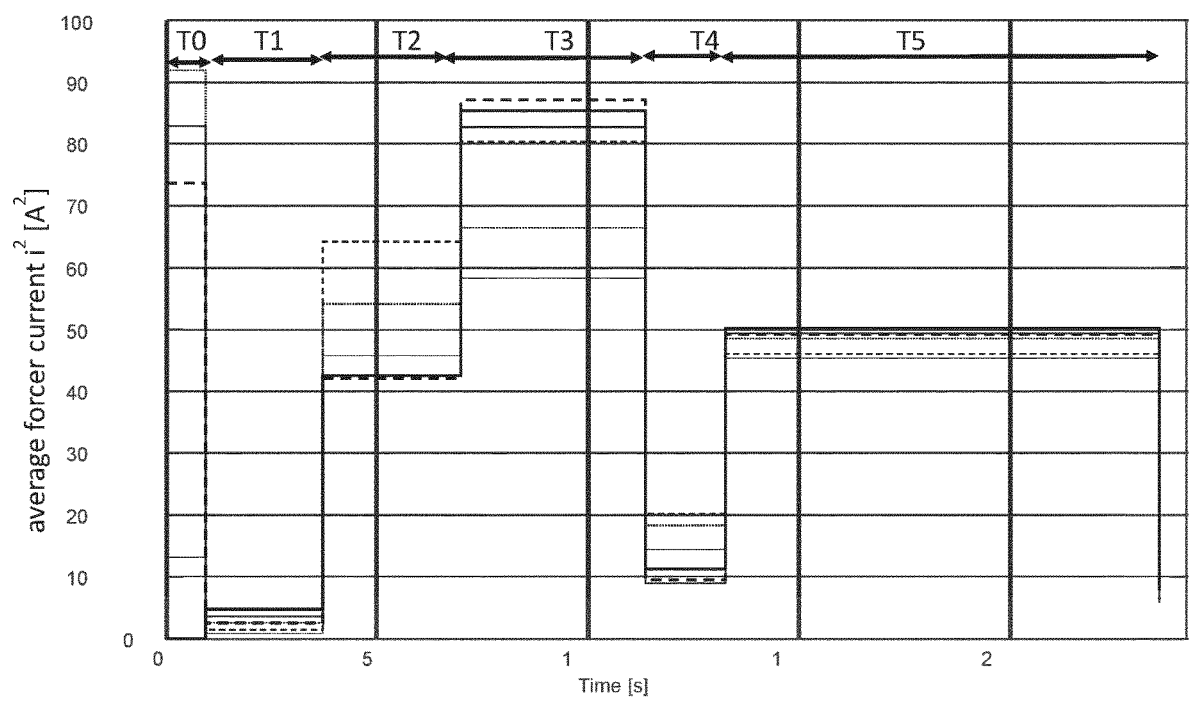
Figure 9:
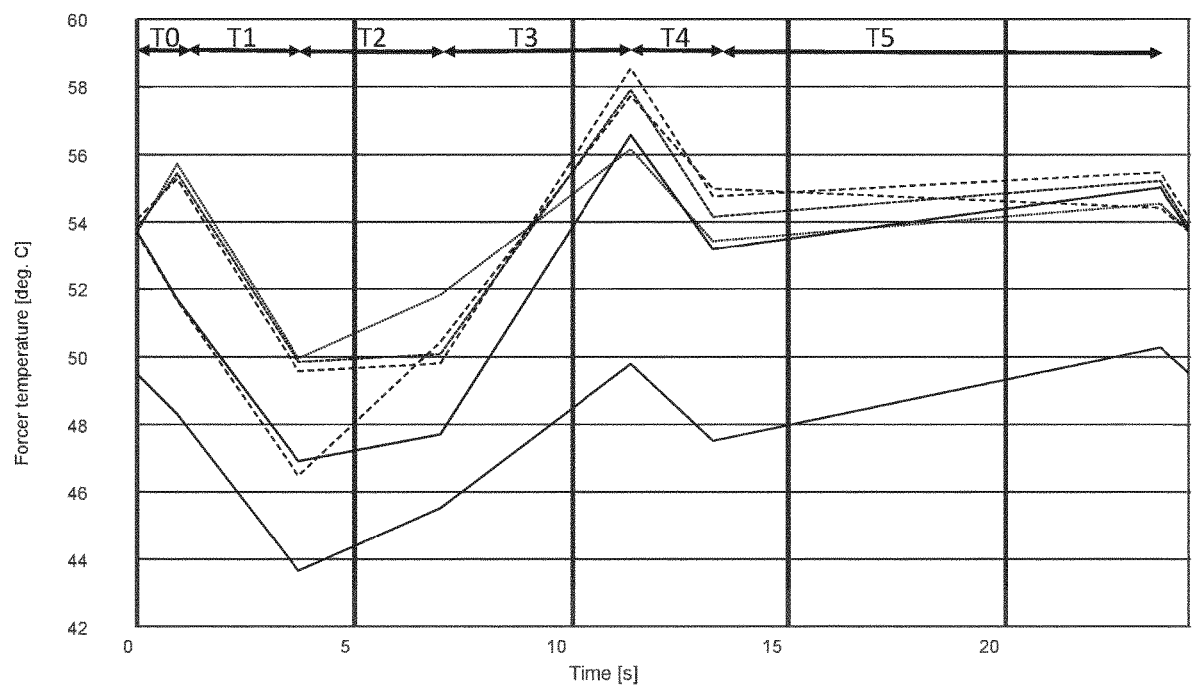

FIG. 9(*a*) schematically illustrates a current squared profile I2(t) for a plurality of positioning devices of a stage apparatus during a LoaW sequence. Each of the graphs of FIG. 9(*a*) thus corresponds the current squared as applied to one of the positioning devices of the stage apparatus, as a function of time. FIG. 9(*a*) also schematically shows a subdivision of the LoaW sequence in different steps or sequences T0-T5. Sequence or period T0 may e.g. be the duration of a loading process of a substrate. Period T1 may e.g. be a transfer process of the stage apparatus to a measurement location.

Periods T2 and T3 may e.g. be represent different measurement processes as performed on the substrate, whereby during period T3 a mark measurement sequence is executed. Period T4 can e.g. correspond to a transfer of the substrate from the measurement location to an exposure location, whereas period T5 corresponds to the duration of the exposure sequence.

FIG. 9(*b*) schematically shows the corresponding average current squared, which can be considered proportional to the average dissipation, for each of the positioning devices, whereby the average current squared is calculated separately for each step or sequence T0-T5. This results in a step-wise varying dissipation profile for each of the different positioning devices involved.

Once such dissipation profiles, or characteristics representative thereof, are determined, it is possible to determine, for each of the positioning devices involved in the operating sequence, e.g. the LoaW sequence, how the temperature of said positioning device evolves during the operating sequence.

Because the dissipation of a position device is considered constant during each step T0-T5 of the operating sequence, the temperature of the positioning device can be determined analytically; given an initial temperature of a positioning device, an end temperature can be determined for each step of the LoaW, using the step-wise dissipation occurring during the LoaW. For example: the temperature at the end of a step n+1, i.e., $\Delta T_{n+1}$, follows from the temperature at the end of step n as $\Delta T_{n+1}=A_{n+1}\Delta T_n+B_{n+1}$, where parameters $A_{n+1}$ and $B_{n+1}$ e.g. depend on the duration of step n+1, the constant value of the stepwise dissipation profile for step n+1 and physical parameters of the positioning device, such as the electrical resistance of the mover coils, the temperature of the medium that is used to cool the movers and the thermal resistance between the mover and this medium.

FIG. 9(c) schematically shows the temperature of each of the positioning devices involved in the LoaW process of FIG. 9(a), based on the step-wise dissipation profiles of FIG. 9(b).

As can be seen in the graphs of FIG. 9(c), for the thermal load according to FIG. 9(b), the temperature of the positioning devices, referred to as the forcer temperature, of the stage apparatus reaches its maximum at the end of period T3, period T3 being the period during which the mark measurements sequence is performed.

Once the temperature profiles of the positioning devices has been determined, the method of the second aspect of the present invention provides assessing whether or not the determined mark measurement sequence can be performed. In order to do so, the maximum temperature as determined for each of the positioning devices can be compared to a maximum allowable temperature. In case the temperature of the positioning devices remains below the maximum allowable temperature, the mark measurement sequence can be executed. In case the temperature of one or more positioning devices would go above a maximum allowable temperature, the method according to the present invention proposes to scale down the performance parameters of those one or more positioning devices who's temperature would become too high. Performance parameters that may need to be scaled down may e.g. be applied accelerations of the positioning devices. By doing so, the thermal load of these positioning devices will be reduced, resulting in a lower temperature or temperature rise. It is important to note that the performance parameter need not be scaled down for the entire duration of the operating sequence. Rather, it can be sufficient to scale down the performance parameter, e.g. an applied acceleration, during only the mark measurement sequence.

When one or more of the performance parameters have been scaled down, e.g. a maximum acceleration of an X-mover is reduced with 10% during part of the operating sequence, a check can be made whether the amended performance parameter result in an allowable temperature profile. This can e.g. be done by recalculating the dissipation profiles and temperatures profiles, using the scaled down performance parameters. Note that, because of the use of step-wise dissipation profiles as described above, such a recalculation requires one a small computational effort. It can also be pointed out that several processes as performed during the operating sequence or LoaW are independent of the mark measurement sequence. The dissipation profiles of such processes, or the thermal effects thereof, thus do not need to be recalculated. In fact, they only need to calculated once as they are independent of the applied mark measurement sequence. Examples of such processes are the loading and unloading processes and the displacement process from a measurement location to an exposure location.

As such, the second aspect of the present invention provides an approach whereby the performance parameters, e.g. the aforementioned VAJs, of specific positioning devices are tailored so as to meet thermal boundary conditions for a given operating sequence.

Compared to the conservative approach indicated above, i.e. an approach whereby the performance parameters of all positioning devices are selected, i.e. scaled down, such that all mark measurement sequences can be performed, the approach according to the second aspect of the invention will result in a faster execution of the mark measurement sequence, and thus the overall LoaW sequence, without breaching any thermal boundary conditions.

In addition, it can be mentioned that the method according to the second aspect of the invention, can be performed with less computational effort that the method according to the first aspect of the invention.

It can further be pointed out that the method according to the second aspect of the invention allows, similar to the method according the first aspect of the invention, to take account of any processes that are performed prior to the mark measurement sequence and after the mark measurement sequence. Similarly, the method according to the second aspect of the invention can take account of an initial temperature of the positioning devices. In this respect, it can be pointed out that the method according to the second aspect of the invention can also determine the appropriate performance parameters for the positioning devices for each substrate separately. Referring to FIG. 7, it can be pointed out that when the initial temperature of the positioning devices is low, e.g. at the start of a new lot of substrates, the first few substrates may be subjected to the mark measurement sequence with higher performance parameters that substrates that are processed when the temperature profiles or cycles have stabilized, i.e. when the temperature of a positioning device at the end of the LoaW is substantially the same as at the beginning of the LoaW. Note that FIG. 9(c) depicts such a stabilized situation, whereby the temperature of the positioning devices at the beginning of the operating sequence T0-T5 is substantially the same as at the end of the sequence. Using the method according to the second aspect of the invention, a temperature profile for the positioning devices of the stage apparatus during the processing of multiple substrates may be determined as well. The temperatures profiles such as the profiles shown in FIG. 9(c) would then extend over multiple LoaWs, whereby the end temperatures occurring at the processing of a first substrate would become the starting temperatures at the processing of a second substrate.

It can be pointed out the that different methods as described above, in particular the methods according to the first aspect of the invention and the methods according to the second aspect of the invention may also be combined. They may e.g. be applied in sequence, e.g. starting with a method according to the second aspect of the invention and, when a further optimization is required, followed with a method according to the first aspect of the invention.

The methods for determining a mark measurement sequence have been evaluated and compared to the known method of minimizing the total distance travelled. As a result of the application of the method according to the invention, e.g. to measure the location of a plurality of alignment marks on a substrate prior to the exposure of the substrate, an improved throughput of the lithographical apparatus can be obtained. Alternatively, or in addition, the gain that is realised by reducing the duration of the mark measurement sequence can, partly or entirely be used to establish a more detailed mark measurement sequence, i.e. a mark measurement sequence containing more marks to be measured.

As illustrated above, the method according to the present invention may advantageously be applied to optimize a routing to be executed by a stage apparatus, e.g. a routing to determine a position or location of a plurality of alignment marks on a substrate.

It will be appreciated by the skilled person that the present invention may advantageous be applied for other purposes as well. In particular, the method according to the invention may also advantageously be applied to determine an optimal routing for an inspection apparatus that is configured to inspect certain features on an object, said features being located at different locations on the object. Said features may e.g. require inspection to assess a proper functioning of the device made or to assess a process that has been performed on the object. The inspection may also involve a search for any defects at particular, critical locations on the object. The object concerned may e.g. be a semiconductor substrate or a patterning device or reticle as applied in a lithographic exposure process. As such, the method for determining a measurement sequence according to the present invention may also be considered a defect measurement sequence or a feature measurement sequence that is to be performed by an inspection tool such as an e-beam inspection tool or an optical inspection tool.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Embodiments of the present disclosure can be further described by the following clauses.

1. A method of determining a mark measurement sequence for an object comprising a plurality of marks, the method comprising:
   receiving location data for the plurality of marks that are to be measured;
   obtaining a boundary model of a positioning device used for performing the mark measurement sequence, and
   determining the mark measurement sequence based on the location data and the boundary model.

2. The method according to clause 1, wherein the boundary model comprises a power limit such as a power dissipation limit or an acceleration limit.

3. The method according to clause 1 or clause 2, further comprising:
   obtaining thermal state information of the positioning device, the thermal state information representing a thermal state of the positioning device prior to an execution of the mark measurement sequence and/or after an execution of the mark measurement sequence, and
   determining the mark measurement sequence based on the thermal state information.

4. The method according to clause 3, wherein the thermal state information comprises a temperature or temperature estimate of the positioning device prior to the execution of the mark measurement sequence.

5. The method according to any of the preceding clauses, wherein the boundary model comprises a thermal model of the positioning device.

6. The method according to clause 3, 4 or 5, wherein obtaining thermal state information comprises:
   receiving process information representing a process to be performed by the positioning device prior to the execution of the mark measurement sequence and/or representing a further process to be performed by the positioning device after the execution of the mark measurement sequence;
   determining the thermal state information based on the process information and the boundary model.

7. The method according to clause 6, wherein the process comprises an exposure process of a previous object and/or wherein the further process comprises an exposure process of the object.

8. The method according to any of the preceding clauses, wherein determining the mark measurement sequence comprises determining a displacement parameter for the positioning device, the displacement parameter being applied by the positioning device during an execution of the mark measurement sequence.

9. The method according to clause 8, wherein the displacement parameter comprises one of a velocity, an acceleration or a jerk of the positioning device.

10. The method according to clause 9, wherein the displacement parameter comprises a velocity, an acceleration or a jerk of the positioning device in one or more predetermined direction.

11. The method according to clause 9 or 10, wherein determining the mark measurement sequence comprises determining a velocity profile for the positioning device during the execution of the mark measurement sequence.

12. The method according to clause 11, wherein the velocity profile comprises a velocity profile for an X-direction and a velocity profile for a Y-direction, the Y-direction being substantially perpendicular to the X-direction, the X-direction and the Y-direction defining a plane substantially parallel to a surface of the object that comprises the plurality of marks.

13. The method according to any of the preceding clauses, wherein determining the mark measurement sequence comprises applying an optimisation algorithm, such as a heuristic optimisation algorithm.

14. The method according to any of the preceding clauses, wherein the mark measurement sequence is determined by applying an optimisation algorithm, a cost function of the optimisation algorithm comprising a duration of an execution of the mark measurement sequence.

15. The method according to clause 14, wherein determining the mark measurement sequence using the optimisation algorithm comprises minimizing the cost function.

16. The method according to clause 14 or 15, wherein the cost function of the optimisation algorithm comprises a thermal state of the positioning device during and/or after the execution of the mark measurement sequence.

17. The method according to any of the clauses 14 to 16, wherein the cost function comprises a temperature constraint, a power constraint or an acceleration constraint.

18. The method according to any of the clauses 14 to 17, wherein applying the optimisation algorithm comprises:
  determining a plurality of possible mark measurement sequences;
  evaluating the plurality of possible mark measurement sequences using the cost function;
  selecting one of the possible mark measurement sequences as the mark measurement sequence, based on the evaluation.

19. The method according to any of the clauses 14 to 17, wherein applying the optimisation algorithm comprises:
  determining a plurality of possible mark measurement sequences;
  evaluating the plurality of possible mark measurement sequences using the cost function;
  determining a further plurality of possible mark measurement sequences based on the evaluation;
  further evaluating the further plurality of possible mark measurement sequences using the cost function;
  selecting one of the further possible mark measurement sequences as the mark measurement sequence, based on the further evaluation.

20. The method according to clause 18 or 19, wherein evaluating the plurality of possible mark measurement sequences comprises determining a compliance of the positioning device with the boundary model for the plurality of possible mark measurement sequences.

21. The method according to any of the preceding clauses referring to clause 5, wherein the thermal model comprises a relationship between a displacement parameter of the positioning device and a temperature of the positioning device.

22. The method according to any of the preceding clauses, wherein the mark measurement sequence comprises an order in which the plurality of marks are to be measured and, at least one displacement parameter for a displacement between each pair of consecutive marks of the plurality of marks.

23. The method according to clause 22, wherein the displacement parameter comprises an acceleration of the positioning device, a velocity of the positioning device and/or a jerk of the positioning device.

24. A stage apparatus for performing a mark measurement sequence for an object comprising a plurality of marks, the stage apparatus comprising:
  an object table for holding the object;
  a positioning device for positioning the object table during an execution of the mark measurement sequence, and
  a control unit for controlling the positioning device during the execution of the mark measurement sequence, wherein the control unit is configured to receive the mark measurement sequence obtained by the method according to any of the clauses 1 to 23.

25. An inspection apparatus comprising:
  a stage apparatus according to clause 24, and
  a measurement apparatus for performing a mark measurement.

26. The inspection apparatus according to clause 25, wherein the measurement apparatus comprises an alignment sensor for performing the mark measurement.

27. A lithographic apparatus comprising a stage apparatus according to clause 24.

28. A computer program product configured to, when run on a computer, perform the method according to any of the clauses 1 to 23.

29. A method of determining a mark measurement sequence for an object comprising a plurality of marks, the mark measurement sequence to be performed by a stage apparatus holding the object, the method comprising:
  receiving location data for the plurality of marks that are to be measured;
  determining a mark measurement sequence based on the location data;
  determining an average dissipation profile for one or more positioning devices of the stage apparatus that are involved in performing the mark measurement sequence, based on the determined mark measurement sequence;
  determining a temperature profile for the one or more positioning devices based on the determined average dissipation profile; and
  adjusting a performance parameter of the one or more positioning devices if a temperature of the one or more positioning devices exceeds a temperature limit, based on the temperature profile.

30. The method according to clause 29, wherein the mark measurement sequence is a distance-optimized mark measurement sequence.

31. The method according to clause 29 or 30, wherein the determining the average dissipation profile comprises determining a dissipation profile for an operating sequence of the stage apparatus, the mark measurement sequence being part of the operating sequence.

32. The method according to clause 31, wherein the operating sequence includes an object loading sequence and an object exposure sequence.

33. The method according to clause 31 or 32, wherein the determining the temperature profile comprises determining a temperature profile for the one or more positioning devices based on the dissipation profile of the operating sequence.

34. The method according to any of clauses 29 to 33, wherein the adjusting the performance parameter comprises scaling down the performance parameter so as to reduce the average dissipation profile.

35. The method according to clause 34, wherein the performance parameter is scaled down during the mark measurement sequence.

36. The method according to clause 34 or 35, whereby the performance parameter comprises an acceleration or deceleration of the positioning device as applied during the mark measurement sequence.

37. A stage apparatus for performing a mark measurement sequence for an object comprising a plurality of marks, the stage apparatus comprising:
 an object table for holding the object;
 a plurality of positioning devices for positioning the object table during an execution of the mark measurement sequence, and
 a control unit for controlling the positioning devices during the execution of the mark measurement sequence, wherein the control unit is configured to receive the mark measurement sequence obtained by the method according to any of the clauses 29 to 36.

The invention claimed is:

1. A method of determining a mark measurement sequence for an object comprising a plurality of marks, the method comprising:
 receiving location data for the plurality of marks that are to be measured;
 obtaining a boundary model of a positioning device used for performing the mark measurement sequence;
 obtaining thermal state information of the positioning device, the thermal state information representing a thermal state of the positioning device prior to an execution of the mark measurement sequence and/or after an execution of the mark measurement sequence; and
 determining the mark measurement sequence based on the location data, the thermal state information and the boundary model.

2. The method according to claim 1, wherein the boundary model comprises a power limit or an acceleration limit.

3. The method according to claim 1, wherein the thermal state information comprises a temperature or temperature estimate of the positioning device prior to the execution of the mark measurement sequence.

4. The method according to claim 1, wherein the boundary model comprises a thermal model of the positioning device.

5. The method according to claim 1, wherein obtaining thermal state information comprises:
 receiving process information representing a process to be performed by the positioning device prior to the execution of the mark measurement sequence and/or representing a further process to be performed by the positioning device after the execution of the mark measurement sequence;
 determining the thermal state information based on the process information and the boundary model.

6. The method according to claim 5, wherein the process comprises an exposure process of a previous object and/or wherein the further process comprises an exposure process of the object.

7. The method according to claim 1, wherein determining the mark measurement sequence comprises determining a displacement parameter for the positioning device, the displacement parameter being applied by the positioning device during an execution of the mark measurement sequence.

8. The method according to claim 7, wherein the displacement parameter comprises a velocity, an acceleration or a jerk of the positioning device.

9. The method according to claim 7, wherein determining the mark measurement sequence comprises determining a velocity profile for the positioning device during the execution of the mark measurement sequence.

10. The method according to claim 1, wherein determining the mark measurement sequence comprises applying an optimisation algorithm.

11. The method according to claim 1, wherein the mark measurement sequence is determined by applying an optimisation algorithm, a cost function of the optimisation algorithm comprising a duration of an execution of the mark measurement sequence.

12. The method according to claim 11, wherein the cost function of the optimisation algorithm comprises a thermal state of the positioning device during and/or after the execution of the mark measurement sequence.

13. The method according to claim 10, wherein applying the optimisation algorithm comprises:
 determining a plurality of possible mark measurement sequences;
 evaluating the plurality of possible mark measurement sequences using a cost function;
 selecting one of the possible mark measurement sequences as the mark measurement sequence, based on the evaluation.

14. The method according to claim 10, wherein applying the optimisation algorithm comprises:
 a. determining a plurality of possible mark measurement sequences;
 b. evaluating the plurality of possible mark measurement sequences using a cost function;
 C. determining a further plurality of possible mark measurement sequences based on the evaluation;
 d. further evaluating the further plurality of possible mark measurement sequences using the cost function;
 e. selecting one of the further possible mark measurement sequences as the mark measurement sequence, based on the further evaluation.

15. The method according to claim 13, wherein evaluating the plurality of possible mark measurement sequences comprises determining a compliance of the positioning device with the boundary model for the plurality of possible mark measurement sequences.

16. A stage apparatus for performing a mark measurement sequence for an object, the stage apparatus comprising:
 an object table configured to hold the object;
 a positioning device configured to position the object table during an execution of the mark measurement sequence, and
 a control unit configured to control the positioning device during the execution of the mark measurement sequence, wherein the control unit is configured to receive the mark measurement sequence obtained by the method according to claim 1.

17. An inspection apparatus comprising:
 the stage apparatus according to claim 16, and
 a measurement apparatus configured to perform a mark measurement.

18. The inspection apparatus according to claim 17, wherein the measurement apparatus comprises an alignment sensor configured to perform the mark measurement.

19. A lithographic apparatus comprising the stage apparatus according to claim 16.

20. A non-transitory computer program product comprising instructions therein, the instructions configured to, when run on a computer system, cause the computer system to at least:
receive location data for a plurality of marks of an object that are to be measured;
obtain a boundary model of a positioning device used for performing a mark measurement sequence;
obtain thermal state information of the positioning device, the thermal state information representing a thermal state of the positioning device prior to an execution of the mark measurement sequence and/or after an execution of the mark measurement sequence; and
determine the mark measurement sequence for the object based on the location data, the thermal state information and the boundary model.

21. A method of determining a mark measurement sequence for an object comprising a plurality of marks, the mark measurement sequence to be performed by a stage apparatus holding the object, the method comprising:
receiving location data for the plurality of marks that are to be measured;
determining a mark measurement sequence based on the location data;
determining a dissipation profile for one or more positioning devices of the stage apparatus that are involved in performing the mark measurement sequence, based on the determined mark measurement sequence;
determining a temperature profile for the one or more positioning devices based on the determined dissipation profile; and
adjusting a performance parameter of the one or more positioning devices responsive to a temperature of the one or more positioning devices exceeding a temperature limit, based on the temperature profile.

22. The method according to claim 21, wherein the mark measurement sequence is a distance-optimized mark measurement sequence.

23. The method according to claim 21, wherein the determining the dissipation profile comprises determining a dissipation profile for an operating sequence of the stage apparatus, the mark measurement sequence being part of the operating sequence.

24. The method according to claim 23, wherein the operating sequence includes an object loading sequence and an object exposure sequence.

25. The method according to claim 23, wherein the determining the temperature profile comprises determining a temperature profile for the one or more positioning devices based on the dissipation profile of the operating sequence.

26. The method according to claim 21, wherein the adjusting the performance parameter comprises scaling down the performance parameter so as to reduce the dissipation profile.

27. A stage apparatus for performing a mark measurement sequence for an object, the stage apparatus comprising:
an object table configured to hold the object;
a positioning device configured to position the object table during an execution of the mark measurement sequence, and
a control unit configured to control the positioning device during the execution of the mark measurement sequence, wherein the control unit is configured to receive the mark measurement sequence obtained by the method according to claim 21.

28. A non-transitory computer program product comprising instructions therein, the instructions configured to, when run on a computer system, cause the computer system to perform at least the method according to claim 21.

* * * * *